(12) United States Patent
Hatano et al.

(10) Patent No.: US 7,489,052 B2
(45) Date of Patent: Feb. 10, 2009

(54) HIGH VOLTAGE PULSE GENERATING CIRCUIT

(75) Inventors: Tatsuhiko Hatano, Kasugai (JP); Takeshi Sakuma, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 269 days.

(21) Appl. No.: 10/579,557

(22) PCT Filed: Nov. 17, 2004

(86) PCT No.: PCT/JP2004/017099

§ 371 (c)(1),
(2), (4) Date: May 16, 2006

(87) PCT Pub. No.: WO2005/050826

PCT Pub. Date: Jun. 2, 2005

(65) Prior Publication Data
US 2007/0145960 A1 Jun. 28, 2007

(30) Foreign Application Priority Data
Nov. 21, 2003 (JP) ............................. 2003-391768

(51) Int. Cl.
*H03K 3/00* (2006.01)
(52) U.S. Cl. .................. 307/106; 315/209 SC; 361/263
(58) Field of Classification Search ................ 307/106, 307/107, 108, 113, 140; 123/603–606, 635, 123/643, 599, 406.56–406.66, 335; 315/39, 315/78, 159, 209 R, 219, 209 SC; 361/263, 361/435
See application file for complete search history.

(56) References Cited

U.S. PATENT DOCUMENTS

| 3,176,158 A | 3/1965 | Guignard |
| 3,367,314 A | 2/1968 | Hirosawa et al. |
| 3,485,227 A | 12/1969 | Meyerle |
| 3,510,676 A | 5/1970 | Pierce |
| 3,671,761 A | 6/1972 | Shibuya et al. |
| 3,877,864 A | 4/1975 | Carlson |
| 4,028,559 A | 6/1977 | Larner |
| 4,740,722 A | 4/1988 | Furuhata |

(Continued)

FOREIGN PATENT DOCUMENTS

EP 0 959 562 A1 11/1999

(Continued)

OTHER PUBLICATIONS

U.S. Appl. No. 11/447,377, filed Jun. 6, 2006 in the name of Tatsuhiko Hatano et al.

(Continued)

*Primary Examiner*—Rajnikant B Patel
(74) *Attorney, Agent, or Firm*—Oliff & Berridge, PLC

(57) ABSTRACT

A high voltage pulse generating circuit comprises an inductor, a first semiconductor switch and a second semiconductor switch connected in series between both ends of a direct current power supply, and a diode wherein a cathode terminal is connected to one end of the inductor whose other end is connected to an anode terminal of the first semiconductor switch, and an anode terminal is connected to a gate terminal of the first semiconductor switch. The inductor has a first coil and a second coil. A diode is connected in parallel to the first semiconductor switch, and a capacitor is connected in parallel to the first coil of the inductor.

14 Claims, 11 Drawing Sheets

U.S. PATENT DOCUMENTS

| | | | |
|---|---|---|---|
| 5,151,762 | A | 9/1992 | Uenishi et al. |
| 5,514,918 | A | 5/1996 | Inatomi et al. |
| 5,530,617 | A | 6/1996 | Bonavia et al. |
| 5,627,741 | A | 5/1997 | Naruo et al. |
| 5,774,348 | A | 6/1998 | Druce et al. |
| 6,608,768 | B2 * | 8/2003 | Sula ............................ 363/18 |
| 6,879,062 | B2 | 4/2005 | Oates |
| 7,084,528 | B2 | 8/2006 | Hatano et al. |
| 2003/0209993 | A1 | 11/2003 | Ito et al. |
| 2003/0230938 | A1 | 12/2003 | Hatano et al. |

FOREIGN PATENT DOCUMENTS

| | | |
|---|---|---|
| EP | 1 376 868 A2 | 1/2004 |
| GB | 2 105 927 A | 3/1983 |
| JP | A-08-223915 | 8/1996 |
| JP | B2-2649340 | 5/1997 |
| JP | A-10-76182 | 3/1998 |
| JP | A-11-145793 | 5/1999 |
| JP | A-2002-044965 | 2/2002 |
| JP | A-2003-272887 | 9/2003 |
| JP | A-2003-338648 | 11/2003 |
| JP | A-2004-072994 | 3/2004 |

OTHER PUBLICATIONS

U.S. Appl. No. 11/293,324, filed Dec. 5, 2005, Sekiya et al.

U.S. Appl. No. 10/576,253, filed Apr. 17, 2006, Hatano et al.

U.S. Appl. No. 11/405,698, filed Apr. 17, 2006, Hatano et al.

Iida et al., "Ultra Short-width High-Voltage Pulse Generator"; The Institute of Electrical Engineers of Japan; Plasma Science and Technology; Dept. of Manufacturing Engineering NGK Insulators, Ltd.; Lecture No. PST-02-16.(w/ abstract).

Jiang et al., "Compact, High Repetition-Rate Pulsed Power Generator Using High-Speed Si-Thyristor"; *IEEE*; pp. 602-604; Jun. 30, 2002; Conference Record of the 25$^{th}$ International Power Modulator Symposium and 2002 High-Voltage Workshop: Jul. 30-Jul. 3, 2002.

Yamashita et al., "High Rep-Rate Inductive-Energy-Storage Pulsed Power Modulator Using High Voltage Static Induction Thyristor"; *IEEE*; pp. 382-385; Jun. 30, 2002; Conference Record of the 25$^{th}$ International Power Modulator Symposium and 2002 High-Voltage Workshop: Jun. 30-Jul. 3, 2002.

Bowles et al., "30 kA, 5000 V Solid State Opening Switch for Inductive Energy Stores"; *IEEE*; vol. 20; pp. 249-253; Jun. 23, 1992; Proceedings of the Power Modulator Symposium: Jun. 23-25, 1992.

Ichikawa et al.; "Deposition of a-Si: H Based film by high voltage pulse discharge CVD"; *Oyo Buturi*; vol. 61, No. 10; Japan Society of Applied Physics; 1992. (w/ partial trans).

Namihira et al.; "Improvement of $NO_x$ Removal Efficiency Using Short-Width Pulsed Power"; *IEEE Transactions on Plasmic Science*; vol. 28, No. 2; p. 434-442; Apr. 2000.

* cited by examiner

CONDUCTION STATE OF 1ST SEMICONDUCTOR SWITCH 24

CONTROL SIGNAL Vc FOR 2ND SEMICONDUCTOR SWITCH 26

10Aa

HIGH VOLTAGE PULSE GENERATING CIRCUIT

TECHNICAL FIELD

The present invention relates to a high-voltage pulse generating circuit of a simple circuit arrangement for releasing electromagnetic energy stored in an inductor from a DC power supply having a low voltage thereby to supply a high-voltage pulse having a very short rise time and a very small pulse duration.

BACKGROUND ART

Technologies for deodorization, sterilization, and toxic gas decomposition based on a plasma developed by high-voltage pulse discharges have recently been put to use. To generate such a plasma, a high-voltage pulse generating circuit capable of supplying extremely narrow pulses of a high voltage is required.

As shown in FIG. 10 of the accompanying drawings, a conventional high-voltage pulse generating circuit 100 has a charger device 102 for generating a high DC voltage which is substantially equal to the peak value of a high-voltage pulse, a capacitor 104 for being charged to the high DC voltage generated by the charger device 102, a switch 108 comprising a plurality of semiconductor devices 106 such as SI (Static Induction) thyristors or the like which are connected in series to provide a high withstand voltage, and a load 110 that is supplied with a high-voltage pulse by high-speed switching operation of the switch 108 under the high DC voltage charged in the capacitor 104 (see, for example, Patent Document 1).

The switch 108 has a plurality of gate drive circuits 112 connected to the respective semiconductor devices 106 to turn on the semiconductor devices 106, and a plurality of balancer resistors 114 connected in parallel to the respective semiconductor devices 106. The balancer resistors 114 serve to reduce any unbalanced differences between the voltages applied across the respective semiconductor devices 106 due to impedance variations caused when the semiconductor devices 106 are rendered nonconductive.

Specifically, the high-voltage pulse generating circuit 100 has a multiple-series-connected circuit 116 of the semiconductor devices 106 and the balancer resistors 114 which are connected in series to the load 110.

FIG. 11 of the accompanying drawings shows a proposed high-voltage pulse generating circuit 118. In the proposed high-voltage pulse generating circuit 118, when a semiconductor switch 126 is turned on, a current flows from a DC power supply 120 (having a power supply voltage E) to a resistor 136 (having a resistance R) to the one-turn primary windings of respective magnetic cores 128 to the semiconductor switch 126 to the DC power supply 120, the current having a magnitude represented substantially by E/R.

At this time, because of the magnetic cores 128 operating as a transformer, the same current flows through the one-turn secondary windings of respective magnetic cores 128 via the gates and cathodes of semiconductor devices 134. Therefore, all the semiconductor devices 134 are simultaneously turned on (see, for example, Non-patent Document 1).

Since the semiconductor devices 134 connected in series to the semiconductor switch 126 are rendered conductive, a voltage which is substantially the same as the power supply voltage E is applied to an inductor 138. As a result, a current $I_L$ flowing through the inductor 138 increases linearly, storing electromagnetic energy in the inductor 138.

The current $I_L$ flowing through the inductor 138 increases until electromagnetic energy is stored up to a desired level in the inductor 138. When the semiconductor switch 126 is then turned off, since the path of the current $I_L$ flowing through the inductor 138 is cut off, an induced voltage of opposite polarity is generated due to the stored electromagnetic energy in the inductor 138.

As a consequence, the diode 140 is rendered conductive, allowing a current to flow continuously from the inductor 138 to the semiconductor devices 134, the primary windings of the respective magnetic cores 128 to the diode 140 to the inductor 138. At this time, a current of the same magnitude also flows through the secondary windings of the magnetic cores 128.

Thus, the current flowing into the anodes of the semiconductor devices 134 flows in its entirety to the gates thereof, with no current flowing to the cathodes thereof. The current flows until the electric charges stored in the semiconductor devices 134 are discharged. Since no large voltage drop is caused in the current path and this state continues for an extremely short period of time, reduction in the current $I_L$ flowing through the inductor 138 is small, and reduction in the stored electromagnetic energy in the inductor 138 is also small.

As the electric charges stored in the semiconductor devices 134 are discharged, the semiconductor devices 134 are turned off, with a depletion layer being quickly developed therein. Since the inductor current is charged with a small electric capacity, the voltage between the anode and cathode of each of the semiconductor devices 134 rises sharply. Therefore, the voltage across the inductor 138 increases quickly, and the current $I_L$ flowing through the inductor 138 decreases quickly. Stated otherwise, the electromagnetic energy in the inductor 138 is shifted into an electrostatic energy in the capacitance between the anode and cathode of each of the semiconductor devices 134. Since the voltage across the inductor 138 is also applied to a load 142, the electromagnetic energy in the inductor 138 and the electrostatic energy in the capacitance between the anode and cathode of each of the semiconductor devices 134 are consumed by the load 142 while the electromagnetic energy is being shifted into the electrostatic energy.

With the high-voltage pulse generating circuit 118, the DC power supply 120 may generate a low voltage and the semiconductor devices 134 may be turned on and off only by currents flowing through the secondary windings of the magnetic cores 128. Consequently, the high-voltage pulse generating circuit 118 requires no gate drive circuits and is relatively simple.

Patent Document 1: Japanese Laid-Open Patent Publication No. 2002-44965

Non-patent document 1: The Institute of Electrical Engineers of Japan, Plasma Science and Technology, Lecture No. PST-02-16 (FIG. 1)

DISCLOSURE OF THE INVENTION

Problems to be Solved by the Invention

However, the conventional high-voltage pulse generating circuit 100 shown in FIG. 10 is of a complex circuit arrangement. Because a high voltage is applied to all the circuit components including a charger device 102, those circuit components need to be insulated against a high voltage, e.g., need a large insulated distance. Therefore, the conventional high-voltage pulse generating circuit 100 tends to be large in size and high in cost.

If only some of the series-connected semiconductor devices 106 are turned on due to a malfunction, then the remaining semiconductor devices 106 may be broken by an overvoltage applied thereto in excess of a rated voltage. The conventional high-voltage pulse generating circuit 100 cannot be expected to operate highly reliably.

Furthermore, for the conventional high-voltage pulse generating circuit 100 to generate a pulse which rises extremely sharply, e.g., at 10 kV/μsec or more, it is necessary that each of the semiconductor devices 106 be turned on quickly. Consequently, even if gate signals are applied to the semiconductor devices 106 at different times that differ only by 2 nsec or 3 nsec from each other, or the semiconductor devices 106 are turned on at different times that differ only by 2 nsec or 3 nsec from each other, generated transient voltages are liable to be out of a state of balance. The conventional high-voltage pulse generating circuit 100 thus suffers much greater difficulty than a series-connected array of semiconductor devices in an ordinary inverter for generating a pulse at several hundreds V/μsec.

With the proposed high-voltage pulse generating circuit 118 shown in FIG. 11, the DC power supply 120 may generate a low voltage and a voltage in excess of the withstand voltage will never be applied to the semiconductor devices 134 even if some of them are turned off due to a malfunction. However, the turn-off times of the semiconductor devices 134 differ from each other, making it highly difficult to prevent transient voltages from being brought out of a state of balance when the semiconductor devices 134 are turned off quickly. Therefore, the proposed high-voltage pulse generating circuit 118 also suffers from the problem with a series-connected array of semiconductor devices.

In the high-voltage pulse generating circuit 118, the magnetic cores 128 are connected in series to the diode 140. As a consequence, there exist inductances due to the physical distance across which the magnetic cores are provided and also due to leakages between the finite primary and secondary windings. Because of those inductances, it takes time to transfer the inductor current to be transferred to the diode 140 when the semiconductor switch 126 is turned off. Therefore, the rate at which the gate currents for turning off the semiconductor devices 134 increase is suppressed, so that the depletion layer starts spreading (the turn-off gain becomes 1 or more) while currents are flowing to the cathodes of the semiconductor devices 134, making the high-voltage pulse generating circuit 118 unstable when the semiconductor devices 134 are turned off sharply.

The present invention has been made in view of the above problems. It is an object of the present invention to provide a high-voltage pulse generating circuit which is of a simple circuit arrangement free of a plurality of semiconductor switches to which a high voltage is applied, and is capable of supplying a high-voltage pulse having an extremely short rise time and an extremely small pulse duration.

Another object of the present invention, in addition to the above object, is to provide a high-voltage pulse generating circuit which can reduce an operating burden on a first semiconductor switch, reduce a switching loss of the first semiconductor switch, and increase a current cutoff resistance thereof.

Still another object of the present invention, in addition to the above object, is to provide a high-voltage pulse generating circuit which can increase a power supply efficiency, the number of output pulses, and the energy of output pulses.

Means for Solving the Problems

A high-voltage pulse generating circuit according to the present invention has an inductor, a first semiconductor switch, and a second semiconductor switch which are connected in series between opposite terminals of a DC power supply unit, a diode having a cathode terminal connected to a terminal of the inductor which has another terminal connected to an anode terminal of the first semiconductor switch, and an anode terminal connected to a gate terminal of the first semiconductor switch, the inductor having a primary winding and a secondary winding, and a capacitor connected in parallel to the primary winding.

When the second semiconductor switch is turned on, the first semiconductor switch is rendered conductive, applying the voltage of the DC power supply unit to the inductor, which stores an induced energy therein. When the second semiconductor switch is subsequently turned off, the first semiconductor switch is also turned off quickly. Therefore, the inductor generates a high-voltage pulse having an extremely short rise time and an extremely small pulse duration.

A load which is supplied with the high-voltage pulse from the inductor may be connected in parallel to the inductor or in parallel to the first semiconductor switch.

The first semiconductor switch may comprise a self-extinguishing or commutation-extinguishing device. Specifically, the first semiconductor switch may comprise an SI thyristor, a GTO (gate turn-off thyristor), an SIT (static induction transistor), a bipolar transistor, a thyristor, or the like. Of these devices, a current-controlled self-extinguishing thyristor, such as a GTO, is suitable. Especially, if a device having a high turn-on/turn-off speed for generating short pulses is required, an SI thyristor is suitable. If the first semiconductor switch has a relatively low turn-on current increase rate, then it can be turned on by a field effect simply when a slight positive voltage is applied between the gate and cathode thereof.

For turning off the first semiconductor switch, a current is caused to flow from the gate to eliminate electric charges stored in the device, thereby forming a depletion layer to achieve a turned-off state. If the high-voltage pulse generating circuit is used in an ordinary inverter or the like, then the first semiconductor switch is turned off when the withdrawal of electric charges is completed even though the turn-off gain is 1 or more, i.e., the gate current is smaller than the anode current and the increase rate of the gate current is not high.

If the first semiconductor switch needs to be turned off quickly such as in pulse power applications, then it is necessary that the first semiconductor switch be ideally and stably turned off such that the turn-off gate current is the same as the anode current (the turn-off gain is 1) or greater than the anode current (the turn-off gain is 1 or smaller) and increases quickly, and the cathode current becomes nil before the withdrawal of electric charges stored in the device is completed.

However, the anode current is usually large, and hence it is very difficult and not practical to cause such a current from the gate with a normally used gate drive circuit in order to turn off the first semiconductor switch with a turn-off gain of 1 or less and quickly (the time required for the gate current to become equal to the anode current is ten and several ns. or less).

The high-voltage pulse generating circuit according to the present invention has a function to achieve an apparent turn-off gain of 1 or less without the need for such a gate drive circuit.

The second semiconductor switch may comprise a self-extinguishing or commutation-extinguishing device. For example, a power metal-oxide semiconductor field-effect transistor is suitable.

In the present invention as described above, a voltage which is substantially equal to the voltage generated across the primary winding of the inductor is also applied to the first semiconductor switch. Therefore, if the secondary winding requires a higher output voltage, then the number of turns of the secondary winding may be made greater than the number of turns of the primary winding. With such an arrangement, a high-voltage pulse having a voltage higher than the withstand voltage of the first semiconductor switch is generated across the secondary winding of the inductor.

According to the present invention, the capacitor is connected in parallel to the primary winding. The capacitor forms a path for transferring thereinto a current flowing through the first semiconductor switch when the second semiconductor switch is turned off and thereafter the first semiconductor switch is turned off.

Therefore, an operating burden of the first semiconductor switch is reduced, reducing the switching loss caused by the first semiconductor switch and increasing the current cutoff resistance of the first semiconductor switch. Particularly, the increased current cutoff resistance leads to an increase in the capacity of the pulsed power supply.

When the first semiconductor switch cuts off a current at a high speed or cuts off a large current, a large surge voltage is applied to the exciting inductance of the inductor and then to the first semiconductor switch. However, the connected capacitor is effective to reduce the surge voltage for thereby improving the reliability of the first semiconductor switch.

The first semiconductor switch which is used may not have a high voltage rise rate (dv/dt) at the time it is turned off. The connected capacitor is effective to adjust the voltage rise rate (dv/dt) of the first semiconductor switch to an allowable level with the capacitance of the capacitor.

Since much of the energy remaining in the capacitor is regenerated in the DC power supply unit, any reduction in the efficiency which is caused by the connected capacitor is small.

As described above, the high-voltage pulse generating circuit according to the present invention is of a simple circuit arrangement free of a plurality of semiconductor switches to which a high voltage is applied, and is capable of supplying a high-voltage pulse having an extremely short rise time and an extremely small pulse duration. An operating burden of the first semiconductor switch is reduced, reducing the switching loss caused by the first semiconductor switch and increasing the current cutoff resistance of the first semiconductor switch (resistance of a first semiconductor switch when it is turned off). As a result, the power supply efficiency is increased, the number of output pulses is increased, and the energy of output pulses is increased.

The above high-voltage pulse generating circuit may have a diode connected in parallel to the first semiconductor switch and having a cathode terminal connected to the anode terminal of the first semiconductor switch. Alternatively, the high-voltage pulse generating circuit may have a diode having an anode terminal connected between the DC power supply and the second semiconductor switch and a cathode terminal connected to the anode terminal of the first semiconductor switch or the other terminal of the inductor.

With the above arrangement, energy remaining in the inductor, e.g., excessive energy (unused energy) from a load if the load is connected to the inductor, and energy stored in the capacitor connected in parallel to the primary winding of the inductor, are returned to the DC power supply unit, contributing to a higher efficiency of operation of the DC power supply unit.

A high-voltage pulse generating circuit according to the present invention has an inductor, a first semiconductor switch, and a second semiconductor switch which are connected in series between opposite terminals of a DC power supply unit, a resistor connected between a terminal of the inductor which has another terminal connected to an anode terminal of the first semiconductor switch, and a gate terminal of the first semiconductor switch, the inductor having a primary winding and a secondary winding, and a capacitor connected in parallel to the primary winding.

With the above arrangement, when the second semiconductor switch is turned on, the first semiconductor switch is reliably turned on. Particularly, if the first semiconductor switch comprises a current-controlled device, it is not turned on unless a current is caused to flow into the gate thereof. The connected resistor is effective in reliably turning on the first semiconductor switch.

The high-voltage pulse generating circuit which employs the above resistor may be low in cost even if the power supply voltage used in the DC power supply is high.

As described above, the high-voltage pulse generating circuit according to the present invention is of a simple circuit arrangement free of a plurality of semiconductor switches to which a high voltage is applied, and is capable of supplying a high-voltage pulse having an extremely short rise time and an extremely small pulse duration. Furthermore, an operating burden of the first semiconductor switch is reduced, reducing the switching loss caused by the first semiconductor switch and increasing the current cutoff resistance of the first semiconductor switch.

As a result, the power supply efficiency is increased, the number of output pulses is increased, and the energy of output pulses is increased.

BEST MODE FOR CARRYING OUT THE INVENTION

High-voltage pulse generating circuits according to embodiments of the present invention will be described below with reference to FIGS. 1 through 9.

Prior to the description of high-voltage pulse generating circuits according to embodiments of the present invention, a basic arrangement and basic operation of a high-voltage pulse generating circuit employed in the embodiments will be described below with reference to FIGS. 1 through 2E.

Figure 1:
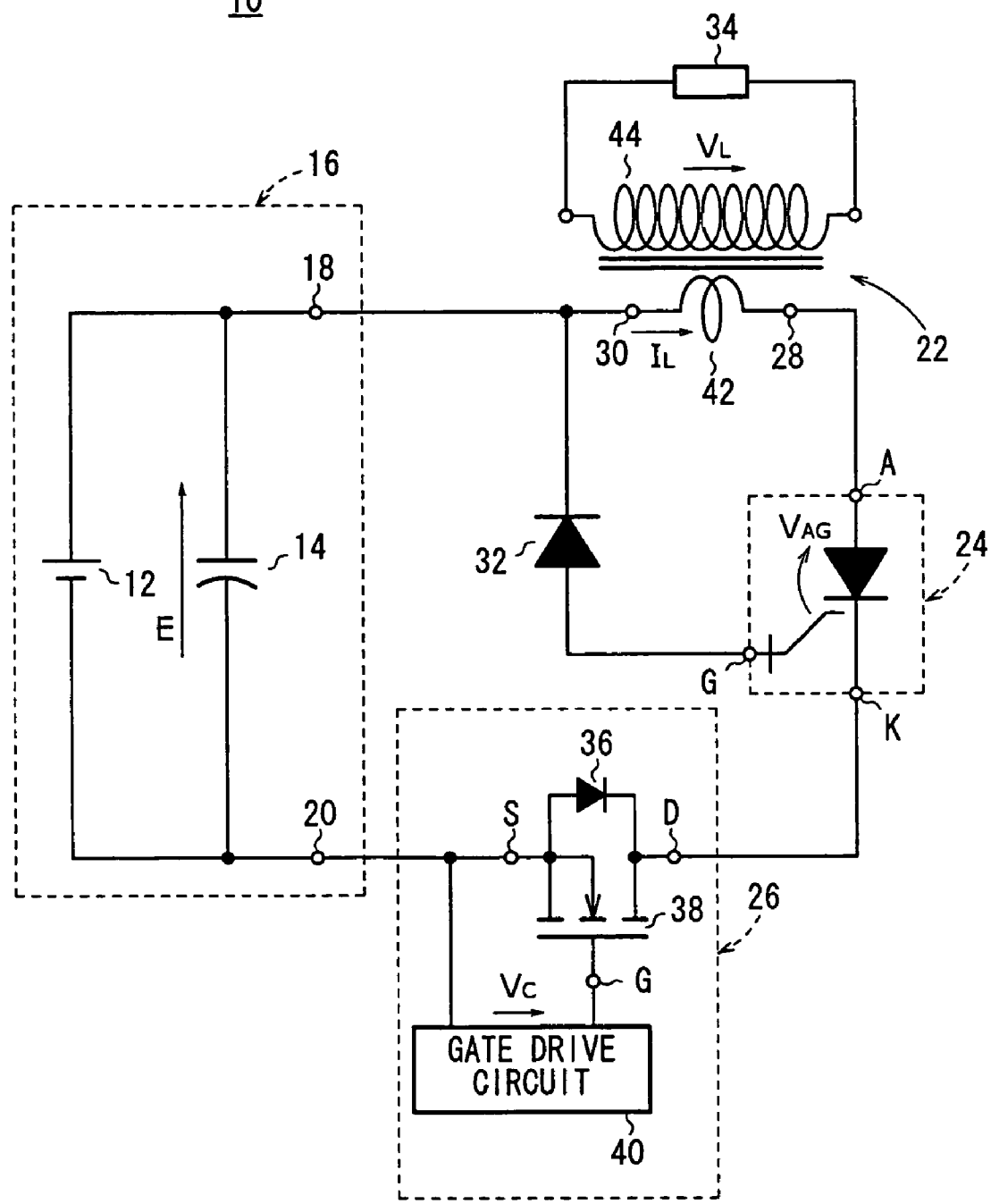
FIG. 1 is a circuit diagram of a high-voltage pulse generating circuit according to a basic arrangement.

As shown in FIG. 1, a high-voltage pulse generating circuit 10 according to a basic arrangement has an inductor 22, a first semiconductor switch 24, and a second semiconductor switch 26 which are connected in series between positive and negative terminals 18, 20 of a DC power supply unit 16. The DC power supply unit 16 comprises a DC power supply 12 and a capacitor 14 for lowering a high-frequency impedance. The inductor 22 has a terminal 28 connected to an anode terminal A of the first semiconductor switch 24 and another terminal 30 connected to a control terminal (gate terminal) G of the first semiconductor switch 24 through a diode 32. The diode 32 has an anode connected to the control terminal G of the first semiconductor switch 24. A load 34 which requires a high-voltage pulse to be applied thereto is connected in parallel to the inductor 22.

In the arrangement shown in FIG. 1, the second semiconductor switch 26 is connected to the negative terminal 20 of the DC power supply unit 16. However, the second semiconductor switch 26 may be connected to the positive terminal 18 of the DC power supply unit 16. Although the load 34 is connected across the inductor 22 in FIG. 1, the load 34 may be connected in parallel to the first semiconductor switch 24.

The second semiconductor switch 26 may comprise a self-extinguishing or commutation-extinguishing device. In the basic arrangement, the second semiconductor switch 26 incorporates a power metal-oxide semiconductor field-effect transistor (hereinafter referred to as power MOSFET) 38 with an avalanche diode 36 in inverse-parallel connection. The second semiconductor switch 26 also has a gate drive circuit 40 connected to a gate terminal G and a source terminal S of the power MOSFET 38 for controlling the turning on and off of the power MOSFET 38.

The first semiconductor switch 24 may comprise a current-controlled device, or a self-extinguishing or commutation-extinguishing device. In the basic arrangement, the first semiconductor switch 24 comprises an SI thyristor having a very large resistance with respect to a voltage rise rate (dv/dt) at the time it is turned off and also having a high voltage rating.

Operation of the high-voltage pulse generating circuit 10 according to the basic arrangement will be described below primarily in a chronological sequence for supplying a high-voltage pulse $V_L$ to the load 34 with reference to the circuit diagram shown in FIG. 1 and waveform diagrams shown in FIGS. 2A through 2E.

At time $t_0$, the gate drive circuit 40 supplies a control signal Vc (see FIG. 2E) between the gate and source of the power MOSFET 38, which is turned on from an off state.

At this time, because of a very large impedance provided in opposite polarity by the diode 32, the first semiconductor switch 24 is turned on due to a field effect by applying a positive voltage between the gate G and cathode K thereof.

Since an anode current of the first semiconductor switch 24 is prevented from rising by the inductor 22, the first semiconductor switch 24 is normally turned on only due to the field effect. Alternatively, a resistor may be connected in parallel to the diode 32 or a resistor connected to another power supply may be connected to the gate terminal G of the first semiconductor switch 24 to positively supply a gate current thereto through such a resistor.

Figure 2A:
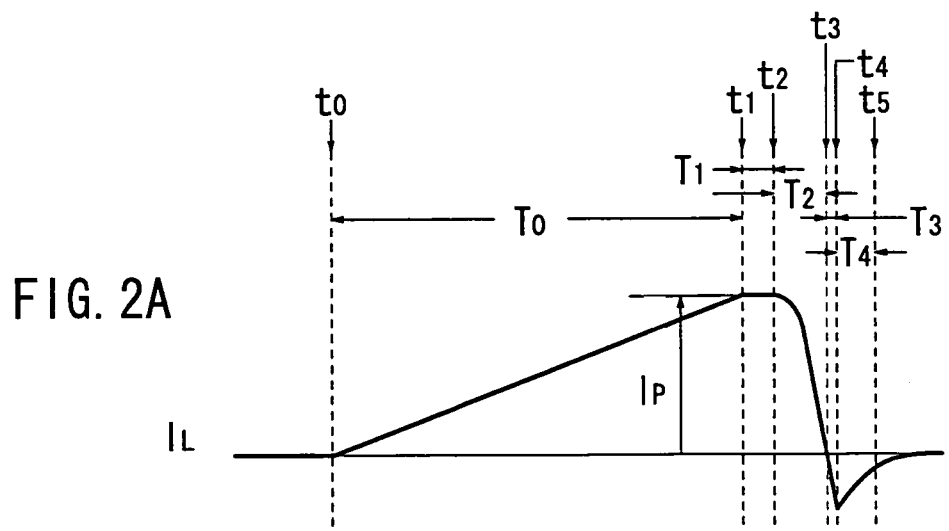
FIGS. 2A through 2E are waveform diagrams showing the waveforms of voltages and currents in the high-voltage pulse generating circuit according to the basic arrangement.

When the second semiconductor switch 26 and the first semiconductor switch 24 are thus rendered conductive at time $t_0$, a voltage which is substantially the same as the DC power supply voltage E of the DC power supply 12 is applied to the inductor 22. If the inductance of the inductor 22 is represented by L, then as shown in FIG. 2A, a current $I_L$ flowing through the inductor 22 linearly increases with time at a gradient represented by E/L.

Figure 2B:
Figure 2C:
Figure 2D:
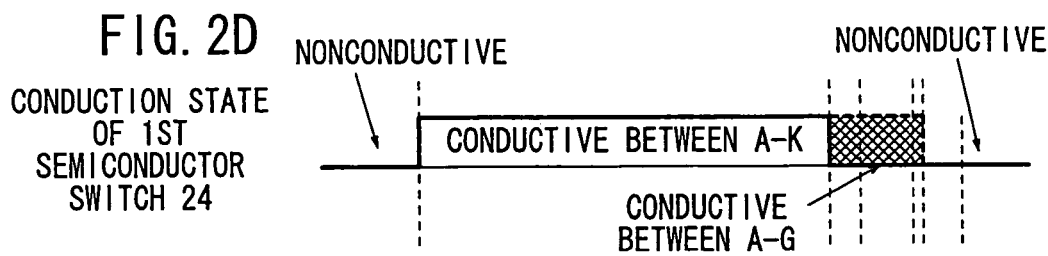
Figure 2E:
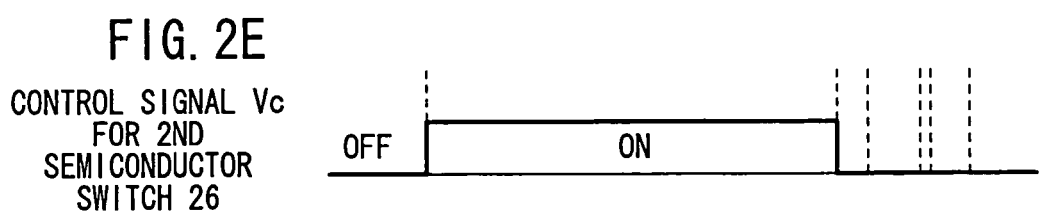

When the current $I_L$ reaches a level Ip ($=ET_0/L$) at time $t_1$, storing a desired amount of electromagnetic energy ($=LIp^2/2$) in the inductor 22, the gate drive circuit 40 stops supplying the control signal Vc, turning off the power MOSFET 38 (see FIG. 2E).

At this time, if a floating inductance (mainly a wiring inductance), not shown, other than the inductance of the inductor 22, which is present in the path of the current $I_L$ is large, then the power MOSFET 38 is not cut off instantaneously. Specifically, the current continues to flow in a slight period of time, and the output capacitance of the power MOSFET 38 is charged up to the avalanche voltage of the diode 36, whereupon the diode 36 is rendered conductive under the avalanche voltage and hence suffers serious damage. To avoid the above drawback, the floating inductance is minimized to allow the power MOSFET 38 to be turned off substantially ideally without causing avalanche across the diode 36.

When the power MOSFET 38 is turned off, the current from the cathode K of the first semiconductor switch 24 is eliminated, i.e., the first semiconductor switch 24 is opened. Therefore, the current $I_L$ flowing through the inductor 22 is cut off, and the inductor 22 tends to generate a reverse induced voltage due to the remaining electromagnetic energy stored therein. At this time, however, the diode 32 operates to transfer the current $I_L$ flowing through the inductor 22 to the path from the anode terminal A of the first semiconductor switch 24 to the gate terminal G of the first semiconductor switch 24 to the anode of the diode 32 to the cathode of the diode 32.

It is necessary that any floating inductance of a branch circuit including the diode 32 be as small as possible to finish the transfer of the current within a short period of time. Since the first semiconductor switch 24 has stored electric charges due to the current which has flowed so far, and the first semiconductor switch 24 remains conductive between the anode and gate thereof until the stored electric charge becomes nil (a storage period), any voltage drop across the above path is small.

Therefore, the reverse induced voltage $V_L$ across the inductor 22 is held to a sufficiently low value, and hence there is almost no reduction in the current $I_L$ in the short storage period (i.e., a period $T_1$ in FIG. 2A). The period $T_1$ is determined depending on the amount of electric charges drawn from the gate terminal G of the first semiconductor switch 24. It is thus required to pass as large a sharply rising current as possible to set an apparent turn-off gain to 1 or less for thereby shortening the period $T_1$ to minimize any reduction in the current $I_L$ through the inductor 22.

At time $t_2$, the electric charges are completely drawn from the first semiconductor switch 24, and a depletion layer in the first semiconductor switch 24 spreads from the gate toward the cathode, starting to turn off the first semiconductor switch 24. Because the depletion layer depends on a potential developed in the first semiconductor switch 24, the depletion layer spreads as the voltage applied to the junction increases and the turn-off process progresses, and finally reaches a position near the anode.

Therefore, the electric capacitance of the depletion layer changes from a saturated state (conductive state) where many active electric charges are present to a small electric capacitance which is structurally determined. The current based on the electromagnetic energy stored in the inductor 22 continuously flows from the anode to the gate of the first semiconductor switch 24, thus charging the electric capacitance of the depletion layer. The voltage for charging the electric capacitance, i.e., the anode-to-gate voltage $V_{AG}$ of the first semiconductor switch 24 initially increases relatively gradually due to the large electric capacitance, and then increases quickly as the depletion layer spreads.

When the current $I_L$ becomes nil at time $t_3$, the voltage $V_{AG}$ and the voltage $V_L$ reach respective maximum levels $V_{AP}$, $V_{LP}$, respectively, as shown in FIGS. 2B and 2C. At this time, the electromagnetic energy stored in the inductor 22 has entirely been shifted into the electric capacitance of the depletion layer in the first semiconductor switch 24.

This phenomenon is a resonant action based on the inductance of the inductor 22 and the electric capacitance of the first semiconductor switch 24. Consequently, the current $I_L$ flowing through the inductor 22 is essentially of a cosine waveform, and the anode-to-gate voltage $V_{AG}$ of the first semiconductor switch 24 is essentially of a sine waveform.

By selecting the value of the inductance of the inductor 22 whose constant can freely be determined, the duration of a pulse generated across the inductor 22 and the load 34 connected parallel to the inductor 22 can be controlled. Specifically, if the electric capacitance of the first semiconductor switch 24 is represented by an equivalent capacitance C, then the pulse duration Tp is expressed by:

$$Tp \approx \pi\sqrt{LC}.$$

The electric charges stored in the electric capacitance of the depletion layer in the first semiconductor switch 24 which has been charged to the maximum level $V_{AP}$ at time $t_3$ start to be discharged through a path from the inductor 22 to the diode 32 which has been rendered conductive reversely by the stored electric charges. The electric charges are continuously discharged until the diode 32 recovers itself and becomes nonconductive at time $t_4$. If any energy remains in the inductor 22 and the electric capacitance of the depletion layer in the first semiconductor switch 24 at time $t_4$, then a current due to the remaining energy flows from the DC power supply unit 16 to the diode 36 of the second semiconductor switch 26 to the cathode K of the first semiconductor switch 24 to the anode A of the first semiconductor switch 24.

During a period $T_4$ in which the current flows from the DC power supply unit 16, the high-voltage pulse generating circuit 10 operates in a regenerative mode. In the regenerative mode, the energy which remains in the inductor 22 and the electric capacitance of the depletion layer in the first semiconductor switch 24 is regenerated and contributes to an increase in the operating efficiency of the high-voltage pulse generating circuit 10. Therefore, it is important to reduce the time required to recover the diode 32, i.e., the period $T_3$, as much as possible.

Figure 3:
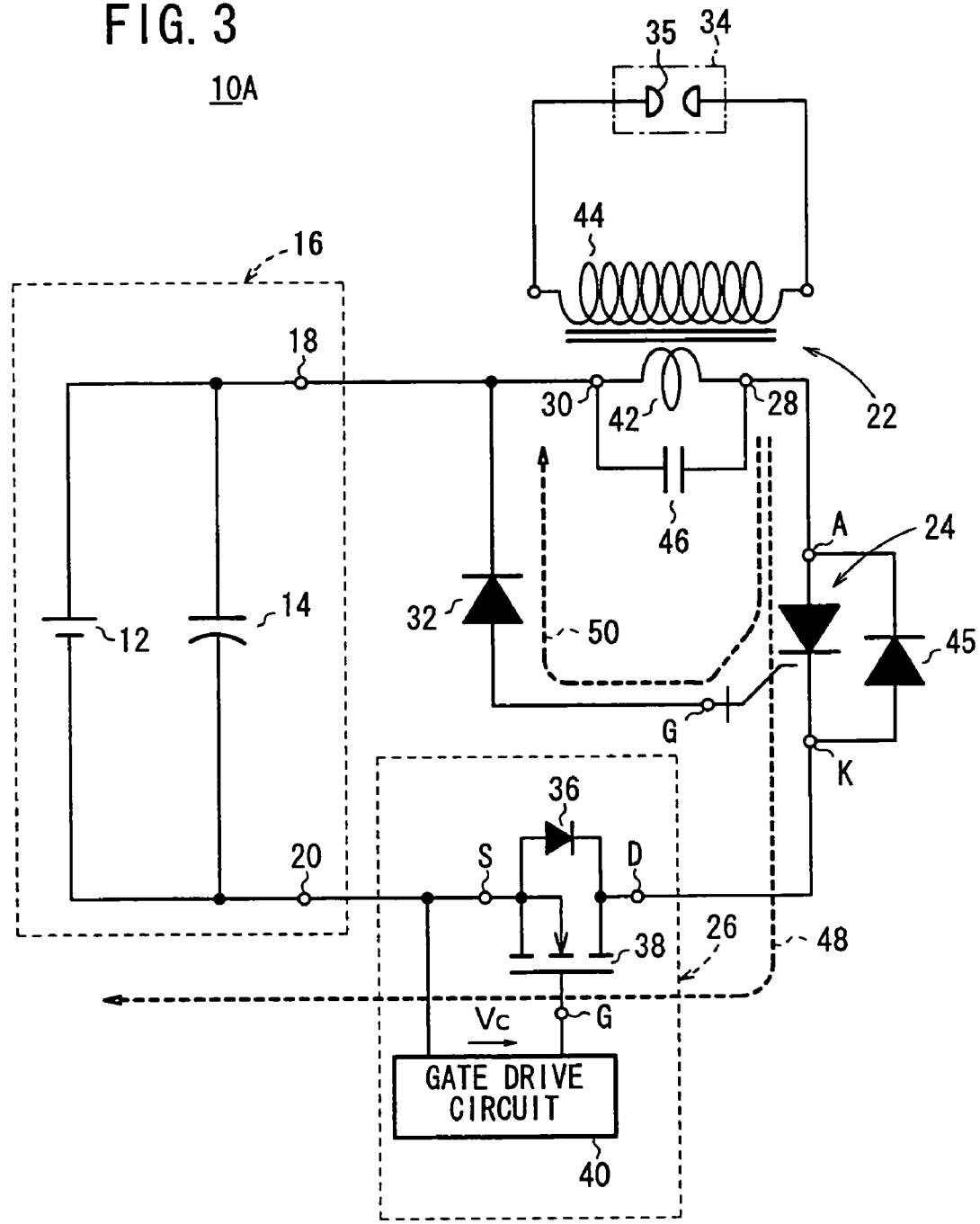
FIG. 3 is a circuit diagram of a high-voltage pulse generating circuit according to a first embodiment of the present invention.

In the above description, the load 34 comprises a linear load which may equivalently be a resistive load. If the load 34 comprises a nonlinear load such as a discharging gap 35 as shown in FIG. 3, then the load impedance is quickly reduced while the voltage is increases, and subsequent waveforms are different from those shown in FIGS. 2B and 2C, i.e., subsequent waveforms are pulse-like waveforms whose pulse durations are smaller than those shown in FIGS. 2B and 2C.

The inductor 22 comprises a primary winding 42 and a secondary winding 44 magnetically coupled to the primary winding 42 and having a greater number of turns than the primary winding 42. The primary and secondary windings 42, 44 should preferably be wound around a magnetic core to provide a close magnetic coupling between the primary and secondary windings 42, 44 and suppress a magnetic flux leakage therefrom.

If the number of turns of the primary winding 42 is represented by N1 and the number of turns of the secondary winding 44 by N2, then the high-voltage pulse generating circuit 10 according to the basic arrangement can output a voltage of $V_{AG} \times N2/N1$ to the load 34. Therefore, the output voltage of the inductor 22 is equal to or higher than the resistance against an anode-to-cathode voltage $V_{AK}$ of the first semiconductor switch 24.

In the basic arrangement, the number of turns of the secondary winding 44 is greater than the number of turns of the primary winding 42 such that the secondary winding 44 is of additive polarity. However, the number of turns of the secondary winding 44 may be smaller than the number of turns of the primary winding 42 such that the secondary winding 44 is of subtractive polarity.

A high-voltage pulse generating circuit 10A according to a first embodiment of the present invention, which comprises the above-described high-voltage pulse generating circuit 10 according to the basic arrangement, will be described below with reference to FIGS. 3 through 7.

The high-voltage pulse generating circuit 10A according to the first embodiment has a diode 45 connected in parallel to the first semiconductor switch 24 in the above basic arrangement and a capacitor 46 connected in parallel to the primary winding 42 of the inductor 22.

The diode 45 has anode and cathode terminals connected respectively to the cathode and anode terminals of the first semiconductor switch 24, and hence is in inverse-parallel connection to the first semiconductor switch 24.

The high-voltage pulse generating circuit 10A according to the first embodiment operates as follows: A current flows through the exciting inductance of the inductor 22 as indicated by a path 48 in FIG. 3, storing energy in the inductor 22. When the power MOSFET 38 is subsequently turned off, the current that has flowed from the anode terminal A to the cathode terminal K of the first semiconductor switch 24 is transferred from the anode terminal A to the gate terminal G, as indicated by a path 50 in FIG. 3. The electric charges remaining in the first semiconductor switch 24 are drawn from the gate of the first semiconductor switch 24, which is then turned off.

Figure 4:
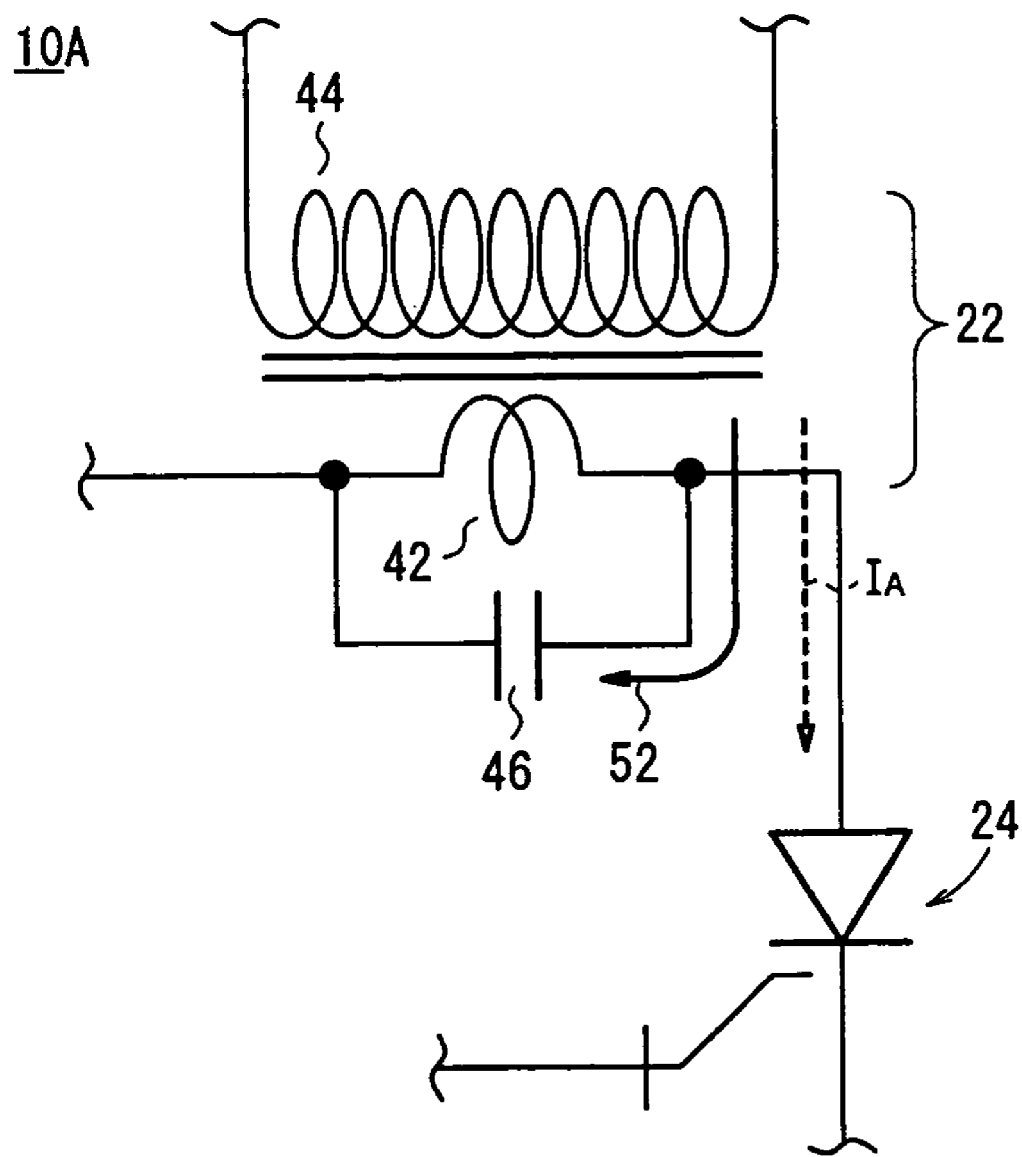
FIG. 4 is a circuit diagram showing the manner in which a current flowing through a first semiconductor switch flows to a capacitor.

At this time, as shown in FIG. 4, the current $I_A$ that has flowed the first semiconductor switch 24 is transferred into a path 52 to which the capacitor 46 is connected, thereby reducing an operating burden on the first semiconductor switch 24.

Figure 5A:
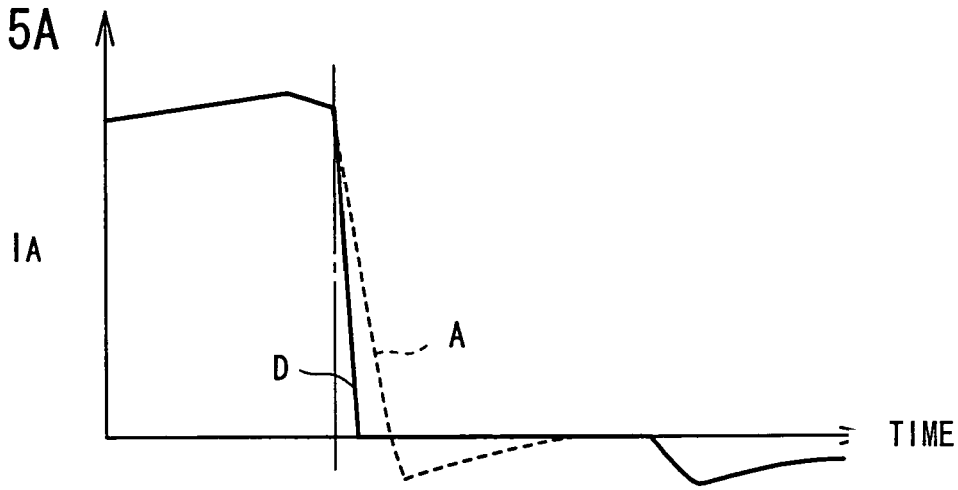
FIG. 5A is a characteristic diagram showing how changes in the anode current of the first semiconductor switch differ when the capacitor is not connected and when the capacitor is connected.
Figure 5B:
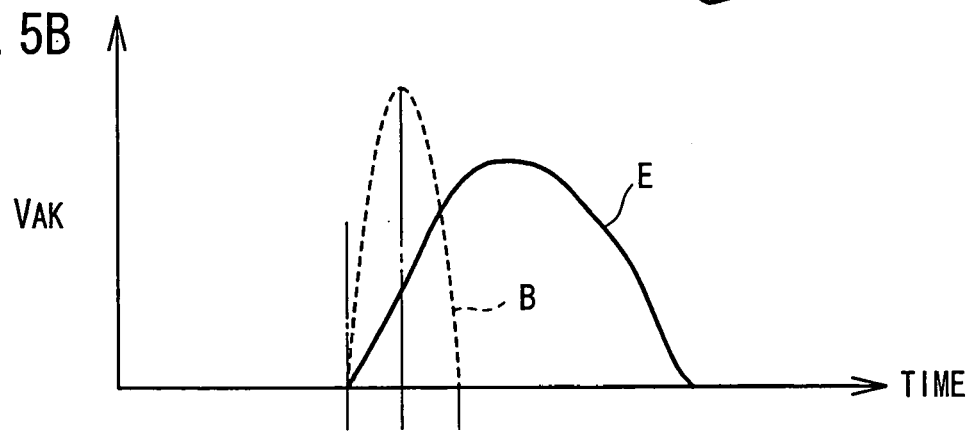
FIG. 5B is a characteristic diagram showing how changes in the anode-to-cathode voltage differ.

If the capacitor 46 were not connected, then, as indicated by the broken-line curve A in FIG. 5, the current $I_A$ which has flowed through the first semiconductor switch 24 would be reduced as the first semiconductor switch 24 is turned off. As indicated by the broken-line curve B in FIG. 5B, an anode-to-cathode voltage $V_{AK}$ of the first semiconductor switch 24 would sharply rise.

Figure 5C:
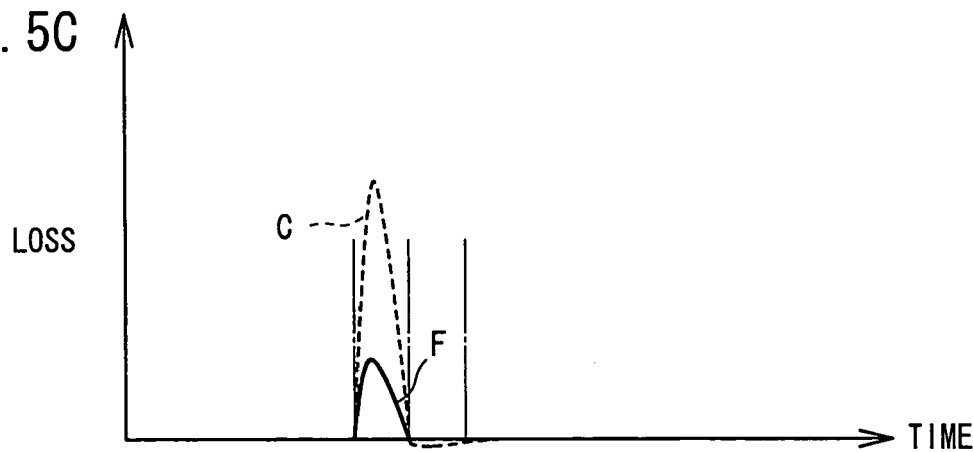
FIG. 5C is a characteristic diagram showing how the switching loss differs.
Figure 6:
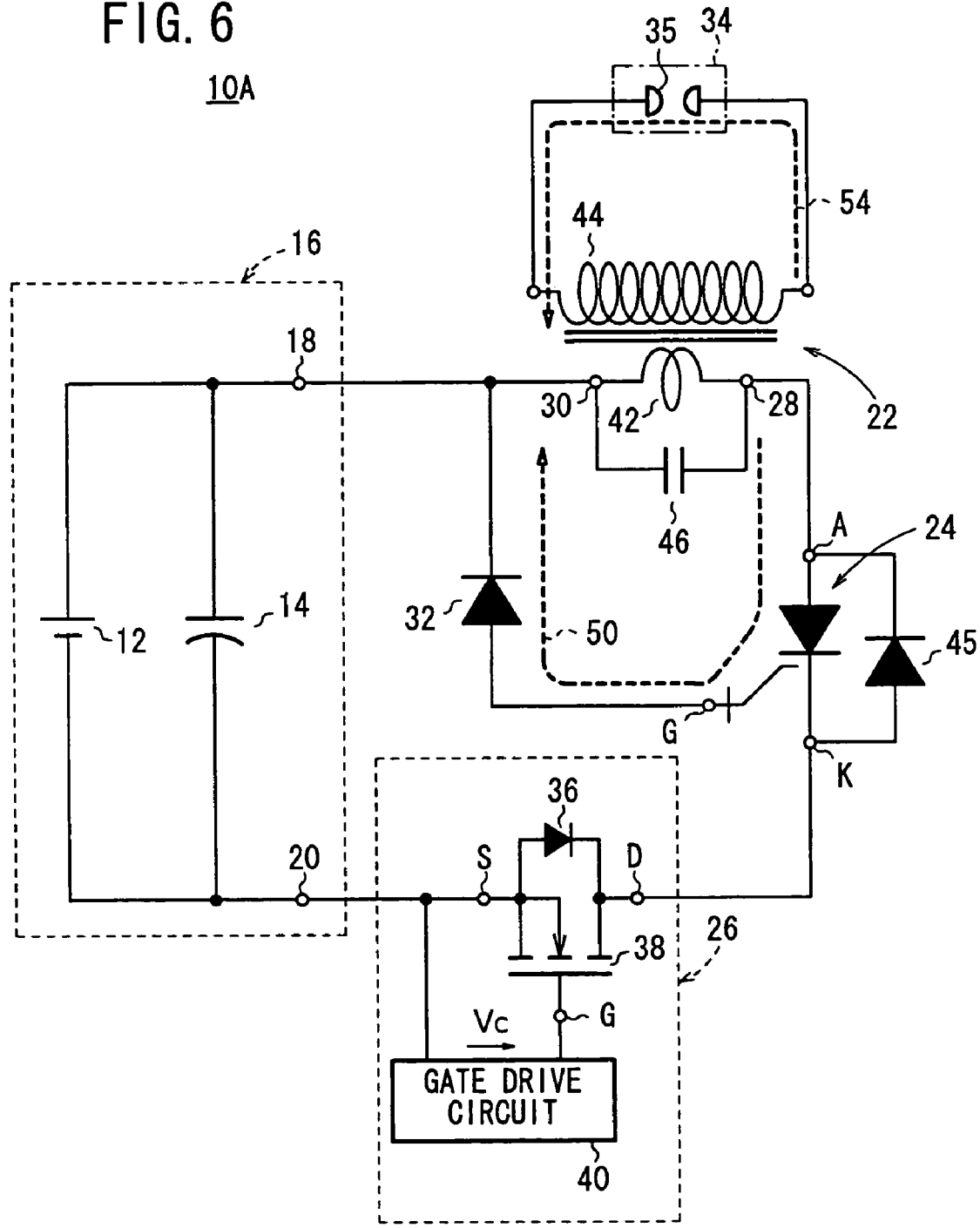
FIG. 6 is a circuit diagram showing the manner in which a current flowing through the exciting inductance of an inductor flows to a load via the inductor.

The anode-to-cathode voltage $V_{AK}$ as it would sharply rise would suffer overshooting (pulse distortion), resulting in an increased switching loss (voltage×current) caused by the first semiconductor switch 24 as indicated by the broken-line curve C in FIG. 5C.

With the capacitor 46 being connected in the first embodiment, the anode current $I_A$ decreases sharply as indicated by the solid-line curve D in FIG. 5A, and the anode-to-cathode voltage $V_{AK}$ rises gradually as indicated by the solid-line curve E in FIG. 5B. Therefore, the switching loss caused by the first semiconductor switch 24 is drastically reduced, as indicated by the solid-line curve F in FIG. 5C.

Consequently, the connected capacitor 46 is effective to reduce the switching loss caused by the first semiconductor switch 24 and increases the current cutoff resistance of the first semiconductor switch 24.

Particularly, the increased current cutoff resistance leads to an increase in the capacity of the pulsed power supply. Specifically, since the energy stored in the exciting inductance of the inductor 22 is determined by ½×(the exciting inductance)×(the cutoff current of the first semiconductor switch 24)², the cutoff current of the first semiconductor switch 24 greatly affects the output capacity of the power supply.

When the first semiconductor switch 24 cuts off a current at a high speed or cuts off a large current, a large surge voltage (pulsed output) is applied to the exciting inductance of the inductor 22 and then to the first semiconductor switch 24. The surge voltage in excess of the voltage rating would adversely affect the first semiconductor switch 24 when applied to the first semiconductor switch 24. However, the connected capacitor 46 is effective to reduce the surge voltage for thereby increasing the reliability of the first semiconductor switch 24.

The first semiconductor switch 24 which is used may not have a high voltage rise rate (dv/dt) at the time it is turned off. The capacitor 46 connected parallel to the first semiconductor switch 24 is effective to adjust the voltage rise rate (dv/dt) of the first semiconductor switch 24 to an allowable level, e.g., 1 kV/μsec, with the capacitance of the capacitor 46, thereby increasing a range of design freedom for the high-voltage pulse generating circuit.

Since much of the energy remaining in the capacitor 46 thus connected is regenerated in the DC power supply unit 16, any reduction in the efficiency which is caused by the connected capacitor 46 is small.

When the first semiconductor switch 24 is turned off, the current that has flowed through the exciting inductance of the inductor 22 is transferred through the inductor 22 to the load 34 (see a path 54). At this time, a large pulse voltage is generated across the inductor 22, producing an electric discharge across the discharging gap 35 of the load 34.

Since a parasitic capacitive component exists in general semiconductor switches which include the first semiconductor switch 24, not all the transferred current flows through the load 34, but some of the current flows to charge the parasitic capacitance of the first semiconductor switch 24.

If the load 34 comprises a capacitive load such as the discharging gap 35, then the energy is consumed by an electric discharge. However, not all the energy may be consumed or no electric discharge may be caused with much energy remains stored.

The remaining electric charges are discharged through the exciting inductance of the inductor 22 (a current flows through the exciting inductance of the inductor 22), so that energy is moved again into the exciting inductance of the inductor 22.

Figure 7:
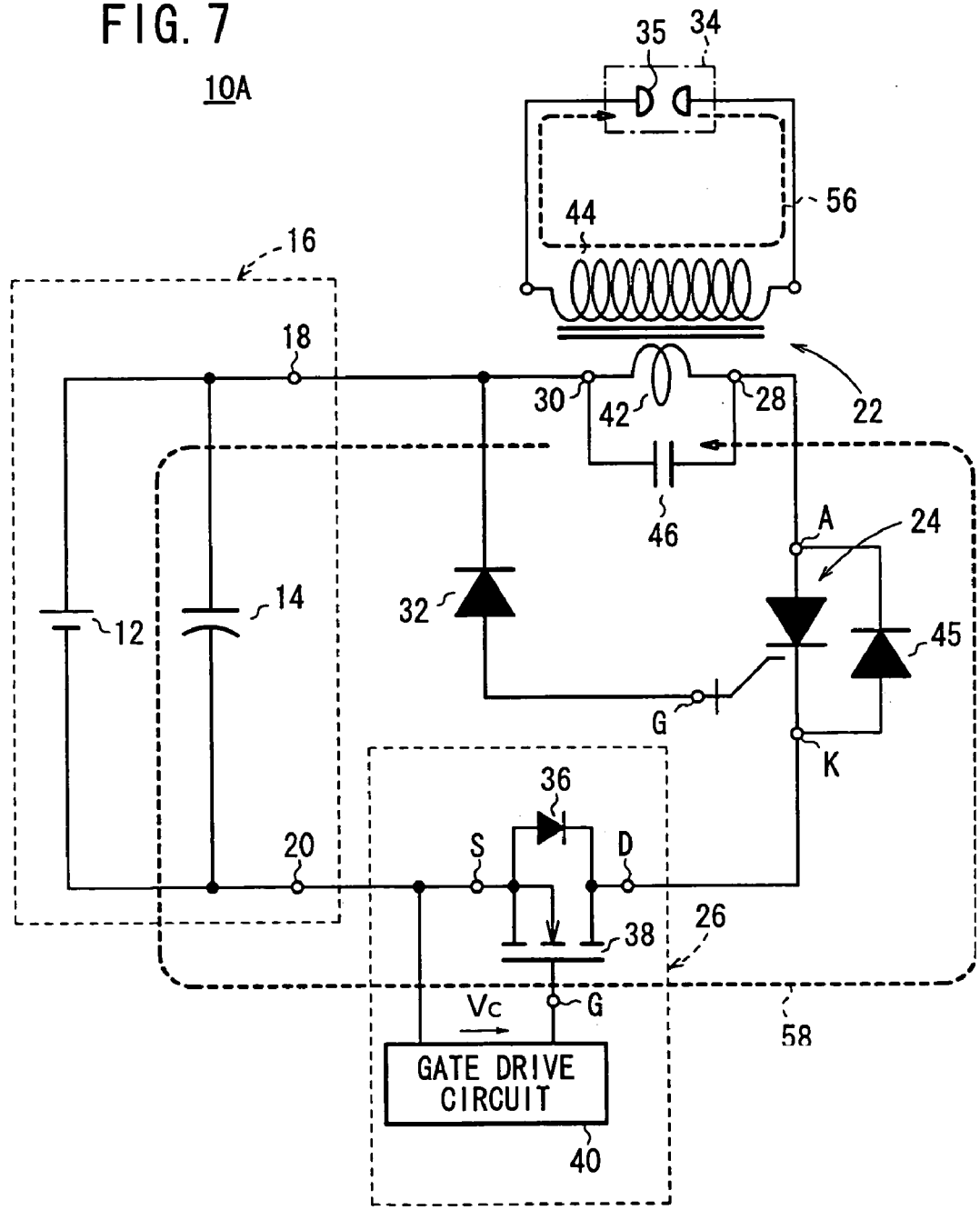
FIG. 7 is a circuit diagram showing the manner in which energy is regenerated.

When the electric charges stored in the load 34 are gone and the movement of energy into the exciting inductance is finished, a current flows through two paths (first and second paths 56, 58), as shown in FIG. 7.

The first path 56 is a path directed toward the load 34 again, and the second path 58 is a path interconnecting the DC power supply unit 16, the diode 36 arranged in inverse-parallel connection to the power MOSFET 38, and the diode 45 arranged in inverse-parallel connection to the first semiconductor switch 24.

The voltage generated by the inductor 22 is clamped by the voltage generated by the DC power supply unit 16 and the two diodes 36, 45, and much of the current flows through the second path 58. The flow of the current through the second path 58 serves to regenerate energy in the capacitor 14 of the DC power supply unit 16 in FIG. 7. In the regenerative mode, much of the energy stored in the capacitor 46, i.e., much of the energy stored in the capacitor 46 after the first semiconductor switch 24 is turned off, is regenerated in the DC power supply unit 16.

Stated otherwise, excessive energy (unused energy) from the load is returned to the DC power supply unit 16, contributing to a higher efficiency of operation of the DC power supply unit 16.

Practically, if the diode 45 were not employed, then the exciting inductance of the inductor 22 and the load 34 would resonate, possibly applying a reversed voltage in excess of the withstand voltage to the first semiconductor switch 24. At this time, the second semiconductor switch 26 would be adversely affected, e.g., would be caused to malfunction, by pulsed noise added to the applied voltage. Therefore, it is preferable to connect the diode 45 for the purpose of processing energy in the exciting inductance.

Figure 8:
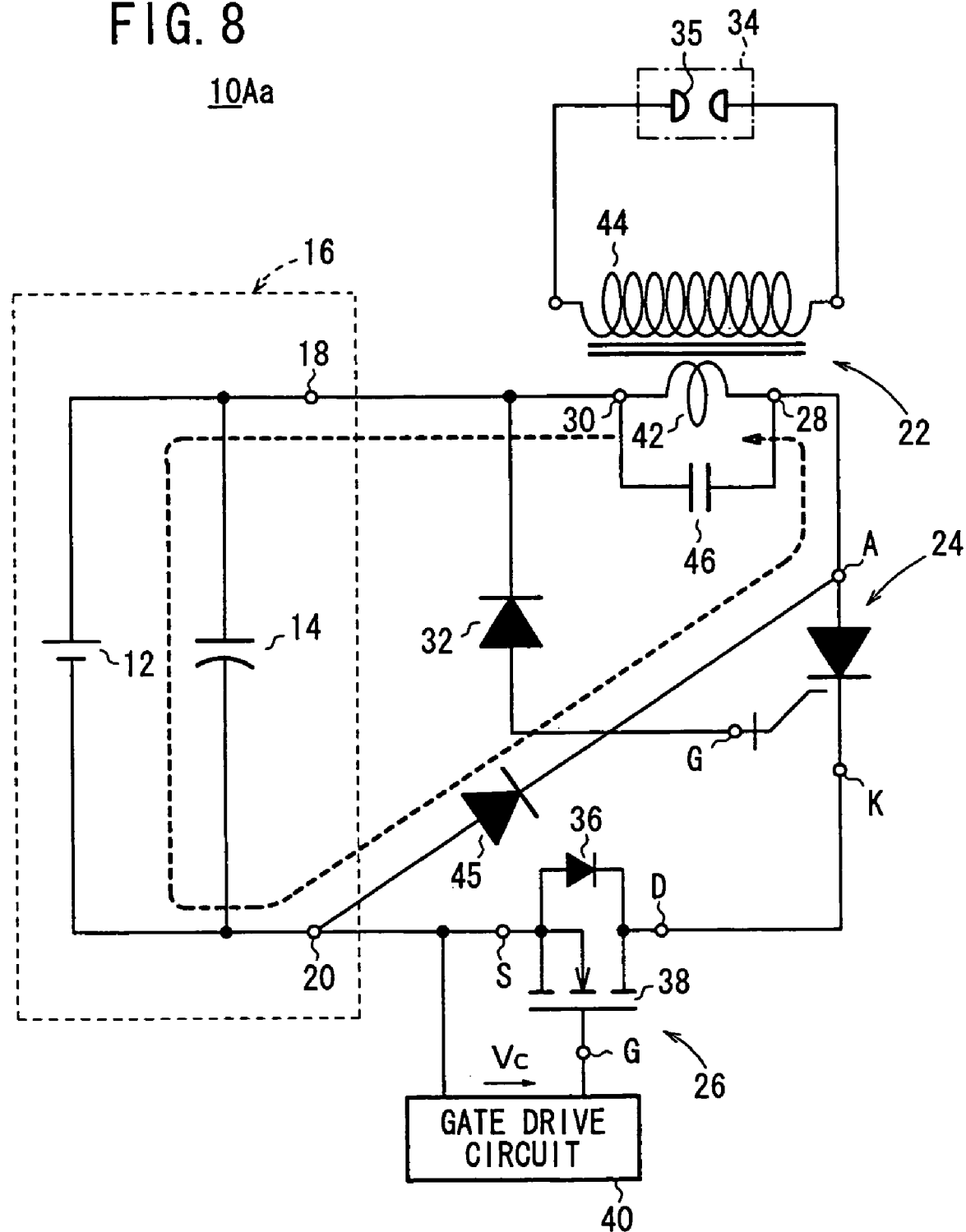
FIG. 8 is a circuit diagram of a high-voltage pulse generating circuit according to a modification.

In the high-voltage pulse generating circuit 10A according to the first embodiment, the diode 45 is connected in inverse-parallel connection to the first semiconductor switch 24. FIG. 8 shows a high-voltage pulse generating circuit 10Aa according to a modification, which has a diode connected between the negative terminal 20 of the DC power supply unit 16 and the anode terminal A of the first semiconductor switch 24 (or the terminal 28 of the inductor 22). The diode 45 has an anode terminal connected to the negative terminal 20 of the DC power supply unit 16 and a cathode terminal connected to the anode terminal A of the first semiconductor switch 24.

A current flows through a path 60 interconnecting the DC power supply unit 16 and the diode 45, regenerating energy in the DC power supply unit 16. The high-voltage pulse generating circuit 10Aa is particularly advantageous in that since only one diode (the diode 45) is connected to the path of the regenerating current, unlike the above embodiment (see FIG. 7), any loss caused upon regeneration of energy is small, and the regeneration efficiency is increased because wiring of the path of the regenerating current can be shortened mechanically.

A high-voltage pulse generating circuit 10B according to a second embodiment of the present invention will be described below with reference to FIG. 9.

The high-voltage pulse generating circuit 10B according to a second embodiment is substantially the same as the high-voltage pulse generating circuit 10A (see FIG. 3) according to the first embodiment, but differs therefrom in that a resistor 62, rather than the diode 32, is connected between the gate terminal G of the first semiconductor switch 24 and the other terminal 30 of the inductor 22.

When the power MOSFET 38 is turned on, the first semiconductor switch 24 can more reliably be turned on. If the first semiconductor switch 24 comprises a current-controlled device, then it is not turned on unless a current is introduced into the gate thereof. The resistor 62 connected as described above is effective in reliably turning on the first semiconductor switch 24.

Use of the resistor 62 makes the high-voltage pulse generating circuit 10B relatively low in cost even if the DC power supply unit 16 is constructed to produce a high power supply voltage. Specifically, if the diode 32 is connected between the gate terminal-G of the first semiconductor switch 24 and the other terminal 30 of the inductor 22 and the DC power supply unit 16 is constructed to produce a high power supply voltage, then the diode 32 needs to comprise a plurality of series-connected diodes for an increased withstand voltage or a diode having a high withstand voltage, which is generally expensive. The resistor 62, however, makes the high-voltage pulse generating circuit 10B lower in cost.

Figure 9:
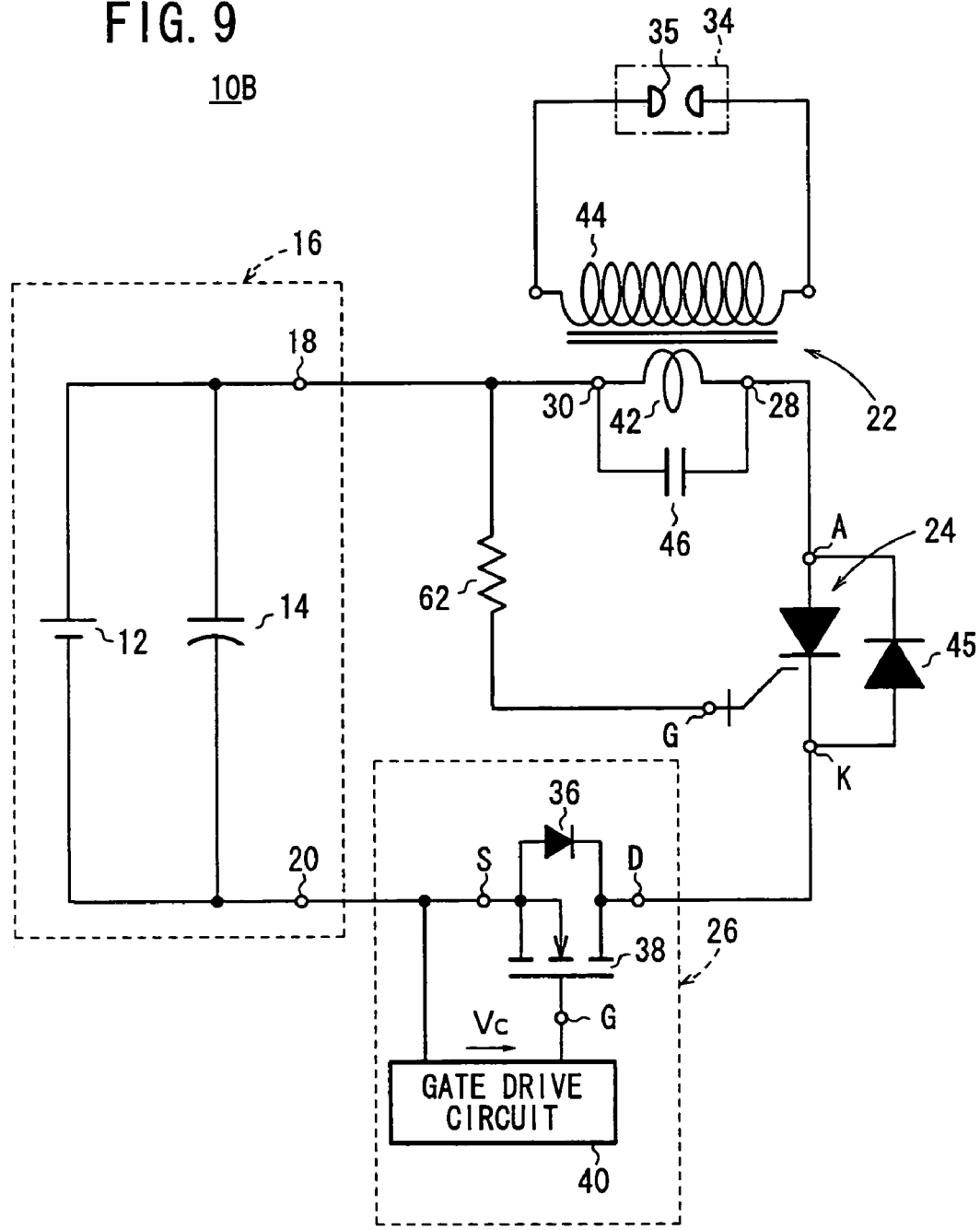
FIG. 9 is a circuit diagram of a high-voltage pulse generating circuit according to a second embodiment of the present invention.

In the embodiment shown in FIG. 9, the diode 45 is connected in parallel to the first semiconductor switch 24. However, as with the modification shown in FIG. 8, the diode 45 may be connected between the negative terminal 20 of the DC power supply unit 16 and the anode terminal A of the first semiconductor switch 24 (or the terminal 28 of the inductor 22).

Figure 10:
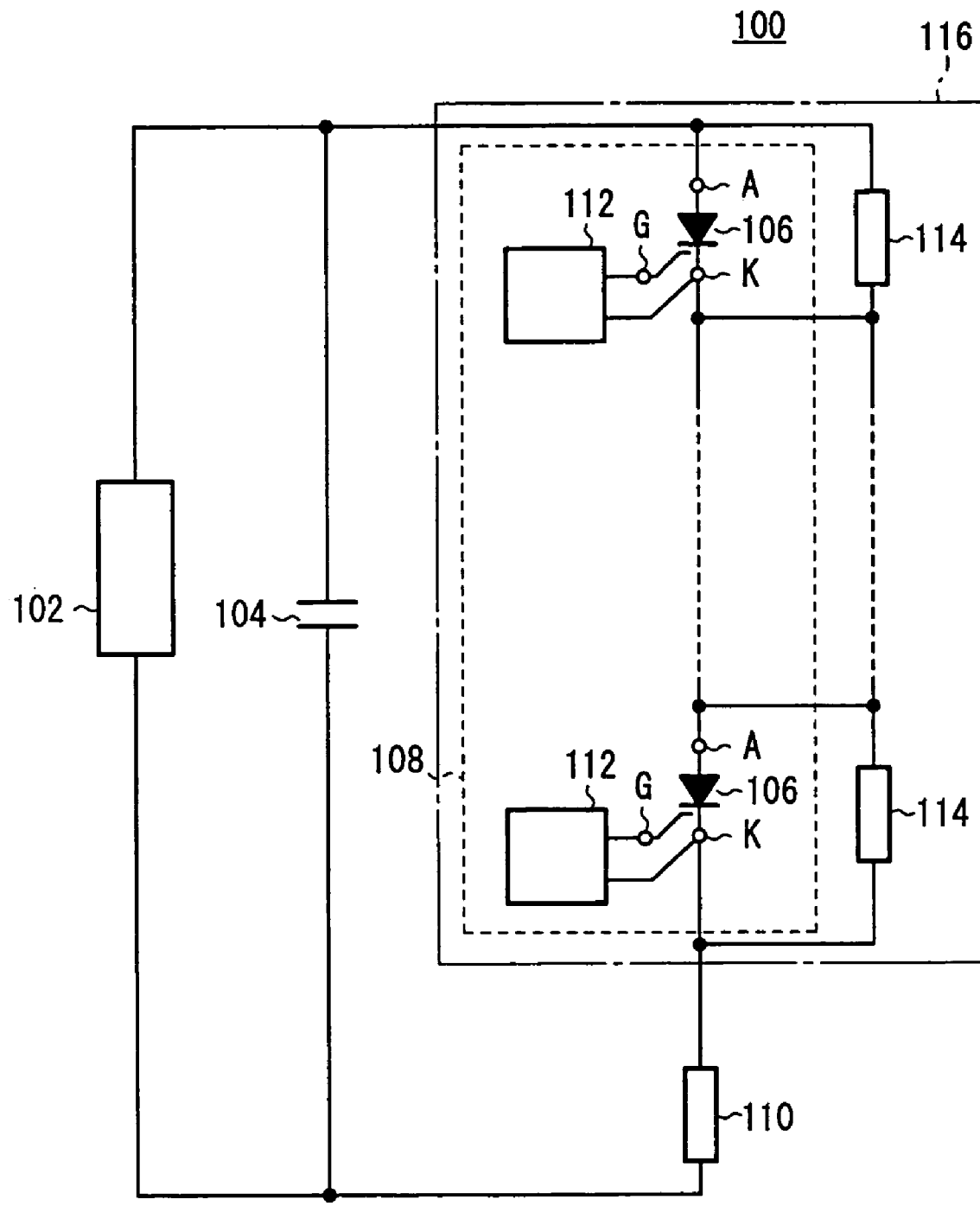
FIG. 10 is a circuit diagram of a conventional high-voltage pulse generating circuit.
Figure 11:
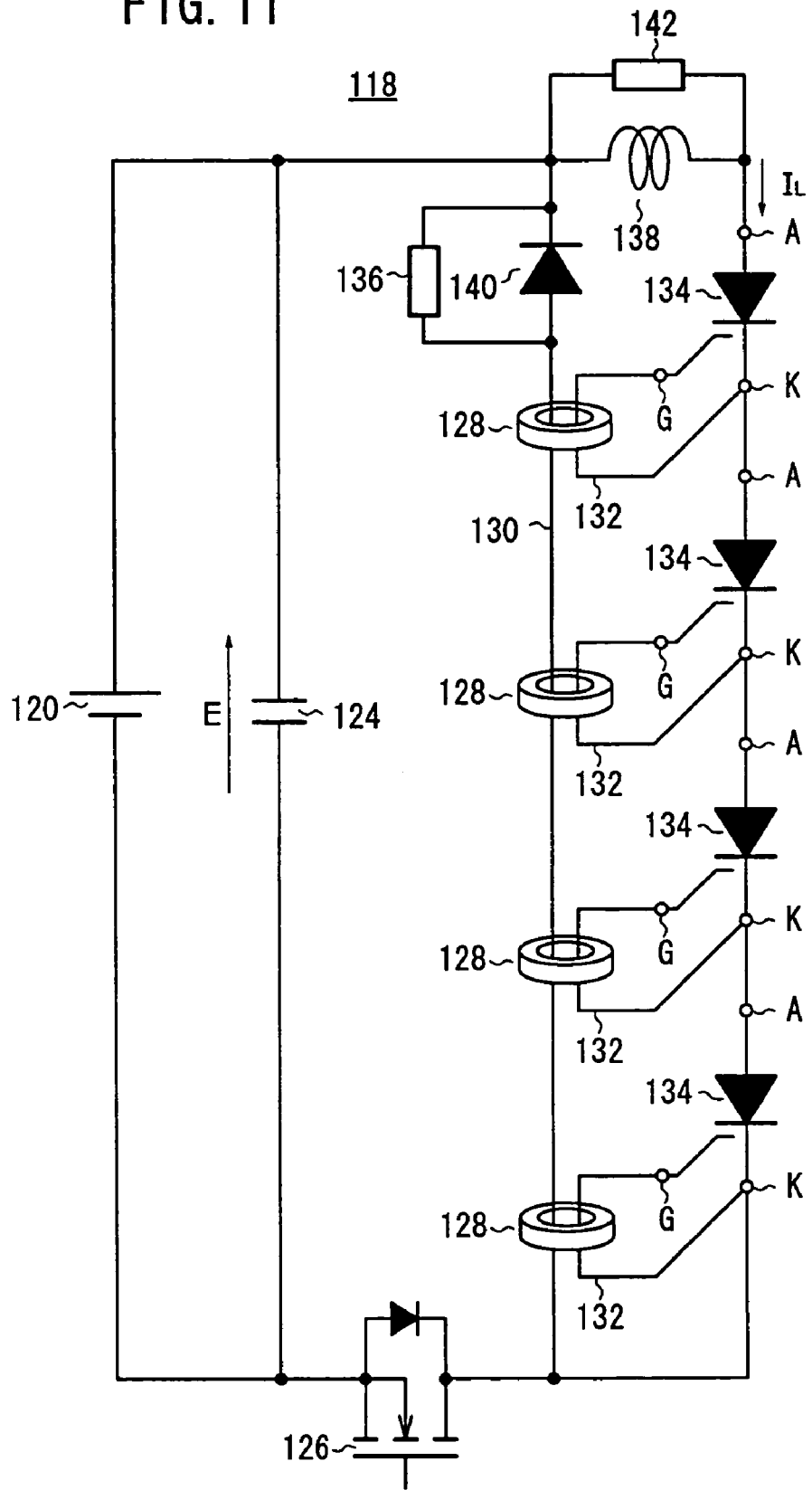
FIG. 11 is a circuit diagram of a proposed high-voltage pulse generating circuit.

The high-voltage pulse generating circuits 10A (10A*a*) and 10B according to the first and second embodiments are advantageous over the conventional high-voltage pulse generating circuit 100 (see FIG. 10) and the proposed high-voltage pulse generating circuit 118 (see FIG. 11) in that only one first semiconductor switch 24 is required as a semiconductor switch to which a high voltage is applied, and a gate drive circuit which is usually used in the form of an electronic circuit for energizing the gate of the first semiconductor switch 24 is not required.

The circuit components of the high-voltage pulse generating circuits where a high voltage is generated or supplied include only the anode terminal A of the first semiconductor switch 24 and the terminal 28 of the inductor 22. The other circuit components may be circuit components according to low-voltage specifications.

For example, if the high-voltage pulse generating circuit according to the present invention is used in an application for decomposing automobile exhaust gases with a plasma generated by a pulse discharge, then the high-voltage pulse generating circuit may be operated by a DC power supply having a power supply voltage of about 42 V, which may be an automobile battery, and the circuit components of the high-voltage pulse generating circuit may have a voltage rating up to several tens of volts. In particular, the conventional high-voltage pulse generating circuit 100 shown in FIG. 10 needs the capacitor charge device 102 as a DC power supply, which is usually very expensive.

The high-voltage pulse generating circuits 10A (10A*a*) and 10B according to the first and second embodiments can suitably be employed in an apparatus which requires a pulse which sharply rises in an extremely short time and which has a high voltage rise rate (dv/dt), such as a plasma generating apparatus for decomposing toxic gases.

Furthermore, in the first and second embodiments, the capacitor 46 is connected in parallel to the primary winding 42 of the inductor 22. Therefore, an operating burden of the first semiconductor switch 24 is reduced, reducing the switching loss caused by the first semiconductor switch 24 and increasing the current cutoff resistance of the first semiconductor switch 24. Particularly, the increased current cutoff resistance leads to an increased capacity of the pulsed power supply. As a result, the power supply efficiency is increased, the number of output pulses is increased, and the energy of output pulses is increased.

Moreover, in the first and second embodiments, the diode 45 is connected in parallel to the first semiconductor switch 24, or the diode 45 is connected between the DC power supply unit 16 and the first semiconductor switch 24. Consequently, energy remaining in the inductor 22, e.g., excessive energy (unused energy) from the load 34 if the load 34 is connected to the inductor 22, and energy stored in the capacitor 46 connected in parallel to the inductor 22, are returned to the DC power supply unit 16, contributing to a higher efficiency of operation of the DC power supply unit 16.

The high-voltage pulse generating circuit according to the present invention is not limited to the above embodiments, but may have various structural details without departing from the gist of the invention.

The invention claimed is:

1. A high-voltage pulse generating circuit comprising:
   an inductor, a first semiconductor switch, and a second semiconductor switch which are connected in series between opposite terminals of a DC power supply unit;
   a diode having a cathode terminal connected to a terminal of said inductor which has another terminal connected to an anode terminal of said first semiconductor switch, and an anode terminal connected to a gate terminal of said first semiconductor switch;
   said inductor having a primary winding and a secondary winding; and
   a capacitor directly connected to a terminal of the primary winding, and connected in parallel to said primary winding.

2. A high-voltage pulse generating circuit comprising:
   an inductor, a first semiconductor switch, and a second semiconductor switch which are connected in series between opposite terminals of a DC power supply unit;
   a resistor connected between a terminal of said inductor which has another terminal connected to an anode terminal of said first semiconductor switch, and a gate terminal of said first semiconductor switch;
   said inductor having a primary winding and a secondary winding; and
   a capacitor directly connected to a terminal of the primary winding, and connected in parallel to said primary winding.

3. A high-voltage pulse generating circuit according to claim 1, wherein said inductor stores induced energy when said first semiconductor switch is rendered conductive by said second semiconductor switch which is turned on, and said inductor generates a high-voltage pulse when said first semiconductor switch is turned off by said second semiconductor switch which is turned off.

4. A high-voltage pulse generating circuit according to claim 3, wherein said capacitor forms a path for transferring thereinto a current flowing through said first semiconductor switch after said second semiconductor switch is turned off.

5. A high-voltage pulse generating circuit according to claim 1, further comprising:
   a diode connected in parallel to said first semiconductor switch and having a cathode terminal connected to said anode terminal of said first semiconductor switch.

6. A high-voltage pulse generating circuit according to claim 1, further comprising:
   a diode having an anode terminal connected between said DC power supply unit and said second semiconductor switch and a cathode terminal connected to said anode terminal of said first semiconductor switch or said other terminal of said inductor.

7. A high-voltage pulse generating circuit according to claim 1, wherein said first semiconductor switch has a static induction thyristor.

8. A high-voltage pulse generating circuit according to claim 1, wherein said second semiconductor switch has a power metal-oxide semiconductor field-effect transistor.

9. A high-voltage pulse generating circuit according to claim 2, wherein said inductor stores induced energy when said first semiconductor switch is rendered conductive by said second semiconductor switch which is turned on, and said inductor generates a high-voltage pulse when said first semiconductor switch is turned off by said second semiconductor switch which is turned off.

10. A high-voltage pulse generating circuit according to claim 9, wherein said capacitor forms a path for transferring thereinto a current flowing through said first semiconductor switch after said second semiconductor switch is turned off.

11. A high-voltage pulse generating circuit according to claim 2, further comprising:
 a diode connected in parallel to said first semiconductor switch and having a cathode terminal connected to said anode terminal of said first semiconductor switch.

12. A high-voltage pulse generating circuit according to claim 2, further comprising:
 a diode having an anode terminal connected between said DC power supply unit and said second semiconductor switch and a cathode terminal connected to said anode terminal of said first semiconductor switch or said other terminal of said inductor.

13. A high-voltage pulse generating circuit according to claim 2, wherein said first semiconductor switch has a static induction thyristor.

14. A high-voltage pulse generating circuit according to claim 2, wherein said second semiconductor switch has a power metal-oxide semiconductor field-effect transistor.

* * * * *